(12) United States Patent
Izumi

(10) Patent No.: US 8,283,743 B2
(45) Date of Patent: Oct. 9, 2012

(54) PHOTODIODE, ULTRAVIOLET SENSOR HAVING THE PHOTODIODE, AND METHOD OF PRODUCING THE PHOTODIODE

(75) Inventor: Takashi Izumi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 48 days.

(21) Appl. No.: 12/318,832

(22) Filed: Jan. 9, 2009

(65) Prior Publication Data

US 2009/0184388 A1    Jul. 23, 2009

(30) Foreign Application Priority Data

Jan. 22, 2008   (JP) .................................. 2008-011906

(51) Int. Cl.
*H01L 27/14*  (2006.01)
*H01L 21/00*  (2006.01)

(52) U.S. Cl. ......... 257/431; 257/E27.122; 257/E21.212; 438/57

(58) Field of Classification Search ............... 257/414, 257/428, 431–466; 438/48, 57–98
See application file for complete search history.

(56) References Cited

U.S. PATENT DOCUMENTS

| | | | | |
|---|---|---|---|---|
| 4,331,486 A | * | 5/1982 | Chenevas-Paule et al. | ... 438/475 |
| 6,452,669 B1 | * | 9/2002 | Morris, Jr. et al. | ............ 356/215 |
| 6,486,071 B1 | * | 11/2002 | Ishikawa | ........................ 438/706 |
| 2001/0044210 A1 | * | 11/2001 | Nakabayashi et al. | ......... 438/692 |
| 2003/0020118 A1 | * | 1/2003 | Kajiwara et al. | ............... 257/347 |
| 2005/0045881 A1 | * | 3/2005 | Nakamura et al. | ............... 257/59 |
| 2006/0131598 A1 | * | 6/2006 | Koh | ................................. 257/98 |

FOREIGN PATENT DOCUMENTS

JP    2007-067331    3/2007

* cited by examiner

*Primary Examiner* — Ha Tran T Nguyen
*Assistant Examiner* — Kevin Quinto
(74) *Attorney, Agent, or Firm* — Kubotera & Associates, LLC

(57) ABSTRACT

A photodiode includes a silicon semiconductor layer; a P-type high concentration diffusion layer with a P-type impurity diffused therein at a high concentration; an N-type high concentration diffusion layer with an N-type impurity diffused therein at a high concentration; and a low concentration diffusion layer with one of the P-type impurity and the N-type impurity diffused therein at a low concentration. The P-type high concentration diffusion layer and the N-type high concentration diffusion layer are formed in the silicon semiconductor layer, and are arranged to face each other with the low concentration diffusion layer in between. The photodiode further includes an interlayer insulation film formed on the silicon semiconductor layer, so that a covalent bond between silicon and hydrogen is formed in an atom row of the low concentration layer adjacent to an interface thereof with respect to the interlayer insulation film. The silicon semiconductor layer where the low concentration layer is formed may have a thickness between 3 nm and 36 nm.

10 Claims, 7 Drawing Sheets

PHOTODIODE, ULTRAVIOLET SENSOR HAVING THE PHOTODIODE, AND METHOD OF PRODUCING THE PHOTODIODE

BACKGROUND OF THE INVENTION AND RELATED ART STATEMENT

The present invention relates to a photodiode for generating an electrical current upon receiving ultraviolet light. Further, the present invention relates to an ultraviolet sensor having the photodiode, and a method of producing the photodiode.

Patent Reference has disclosed a conventional ultraviolet sensor for detecting ultraviolet light. The conventional photodiode includes a P-type silicon substrate having two N-type areas. A P-type diffusion layer is formed in a surface layer of each of the N-type areas. An N-type diffusion layer is formed in an area including an interface of the P-type silicon substrate and the N-type area to face the P-type diffusion layer with the N-type area in between.

In the conventional ultraviolet sensor, depths of the P-type diffusion layers are adjusted to form two photodiodes of a lateral PN junction type. Due to a difference in the depths of the P-type diffusion layers, an amount of ultraviolet light reaching the PN junction below the P-type diffusion layers changes. Further, a photoelectric current of the photodiode having the P-type diffusion layer with a larger depth is subtracted from a photoelectric current of the photodiode having the P-type diffusion layer with a smaller depth to cancel out a photoelectric current of visible light, thereby detecting an intensity of ultraviolet light.

Patent Reference: Japanese Patent Publication No. 2007-67331

In general, ultraviolet light is categorized into three types of light, i.e., long wave ultraviolet light (UV-A light, a wavelength between 320 nm and 400 nm); intermediate wave ultraviolet light (UV-B light, a wavelength between 280 nm and 320 nm); and short wave ultraviolet light (UV-C light, a wavelength of less than 280 nm). More than 90% of ultraviolet light reaching the ground level is formed of the UV-A light, and the remaining portion is formed of the UV-B light. The UV-C light is mostly absorbed in the ozone layer, and does not reach the ground level.

The three types of ultraviolet light have different effects on a human body or environment depending on wavelengths thereof. More specifically, the UV-B light induces skin inflammation and skin cancer. Accordingly, it has been required to develop an ultraviolet sensor capable of effectively separating and detecting the UV-B light.

In the conventional ultraviolet sensor, it is possible to detect a total amount of ultraviolet light in an ultraviolet light region less than 400 nm. However, it is difficult to separate and detect ultraviolet light in a specific wavelength region.

As described above, in the conventional ultraviolet sensor, the depths of the P-type diffusion layers are adjusted for changing the photoelectric currents outputting from the two photodiodes. A different between the photoelectric currents is determined through a calculation, thereby detecting an intensity of ultraviolet light in the ultraviolet light region. Accordingly, when the depths of the P-type diffusion layers are varied upon forming the P-type diffusion layers, an amount of ultraviolet light absorbed in the P-type diffusion layers varies. Accordingly, it is difficult to produce the conventional ultraviolet sensor with stable property.

In view of the problems described above, an object of the present invention is to provide a photodiode and a method of producing the photodiode capable of solving the problems of the conventional ultraviolet sensor. In the present invention, it is possible to effectively separate and detect ultraviolet light in the wavelength region of the UV-B light.

Further objects and advantages of the invention will be apparent from the following description of the invention.

SUMMARY OF THE INVENTION

In order to attain the objects described above, according to the present invention, a photodiode is a lateral PN junction type. The photodiode includes a silicon semiconductor layer; a P-type high concentration diffusion layer with a P-type impurity diffused therein at a high concentration; an N-type high concentration diffusion layer with an N-type impurity diffused therein at a high concentration; and a low concentration diffusion layer with one of the P-type impurity and the N-type impurity diffused therein at a low concentration. The P-type high concentration diffusion layer and the N-type high concentration diffusion layer are formed in the silicon semiconductor layer, and are arranged to face each other with the low concentration diffusion layer in between.

According to the present invention, the photodiode further includes an interlayer insulation film formed on the silicon semiconductor layer, so that a covalent bond between silicon and hydrogen is formed in an atom row of the low concentration layer adjacent to an interface thereof with respect to the interlayer insulation film.

According to the present invention, the silicon semiconductor layer where the low concentration layer is formed may have a thickness between 3 nm and 36 nm.

In the present invention, when light enters the photodiode from the interlayer insulation film, and passes through the covalent bond between silicon and hydrogen formed in the interface of the low concentration diffusion layer with respect to the interlayer insulation film, it is possible to block ultraviolet light in a wavelength region of the UV-A light through a covalent energy of the covalent bond between silicon and hydrogen regardless of the thickness of the silicon semiconductor layer.

Accordingly, when the photodiode is combined with another photodiode having a configuration the same as that of the photodiode without the covalent bond between silicon and hydrogen, it is possible to determine an amount of ultraviolet light only in the wavelength region of the UV-A light through a calculation. Accordingly, it is possible to obtain an ultraviolet sensor capable of stably detecting the amount of ultraviolet light only in the wavelength region of the UV-A light, which is a major component of ultraviolet light reaching the ground level.

Further, when the silicon semiconductor layer where the low concentration layer is formed has the thickness between 3 nm and 36 nm, ultraviolet light in the wavelength region of the UV-A light is blocked with the covalent energy of the covalent bond between silicon and hydrogen. At the same time, visible light is blocked with the silicon semiconductor layer. Accordingly, it is possible to obtain an ultraviolet sensor capable of selectively detecting an amount of ultraviolet light only in the wavelength region of the UV-B light.

DETAILED DESCRIPTION OF PREFERRED EMBODIMENTS

Hereunder, preferred embodiments of the present invention will be explained with reference to the accompanying drawings.

First Embodiment

Figure 1:
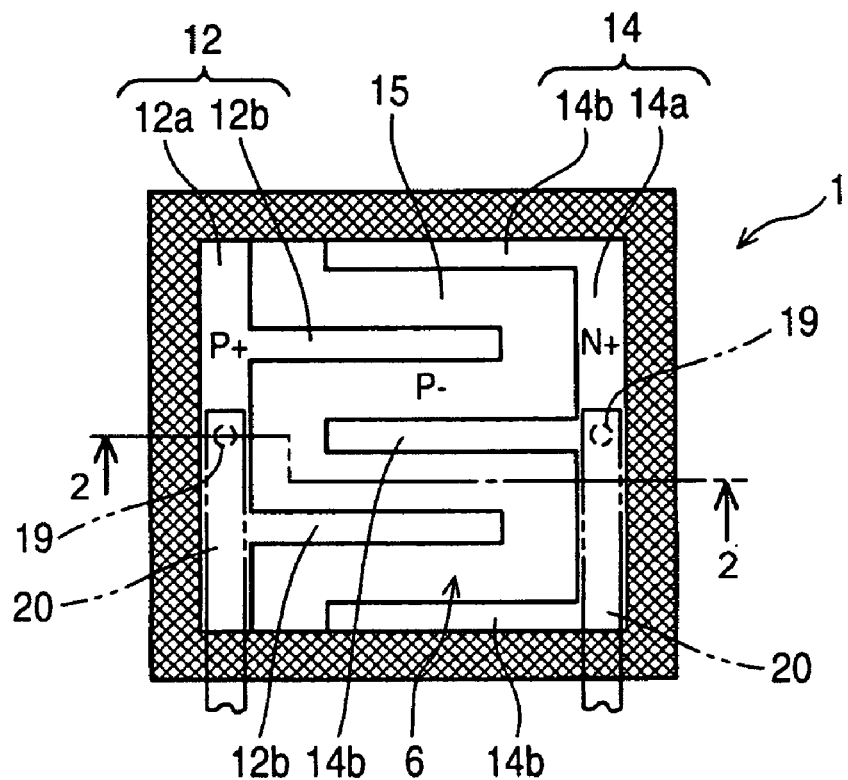
FIG. 1 is a schematic plan view showing a photodiode according to a first embodiment of the present invention.
Figure 2:
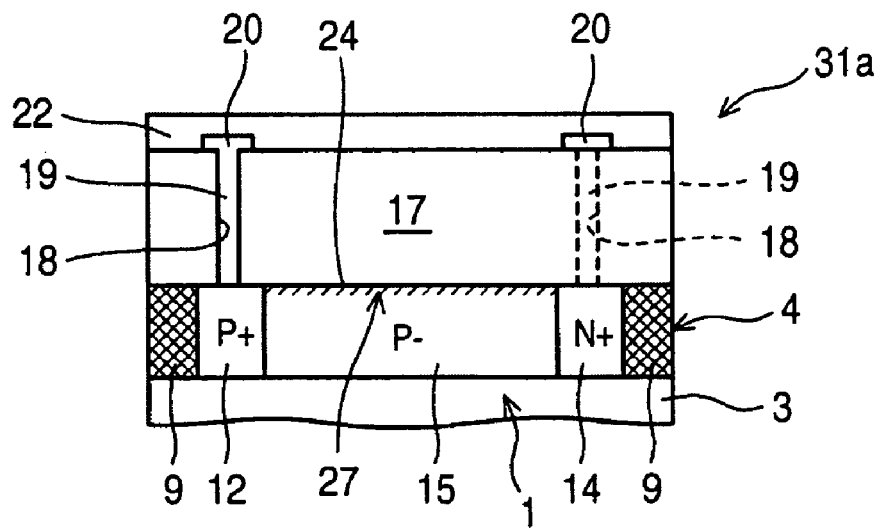
FIG. 2 is a schematic sectional view of the photodiode taken along a line 2-2 in FIG. 1 according to the first embodiment of the present invention.

A first embodiment of the present invention will be explained. FIG. 1 is a schematic plan view showing a photodiode 1 according to the first embodiment of the present invention. FIG. 2 is a schematic sectional view showing the photodiode 1 taken along a line 2-2 in FIG. 1 according to the first embodiment of the present invention. In FIG. 1, an upper layer above a silicon semiconductor layer 4 shown in FIG. 2 is omitted.

As shown in FIG. 1, the photodiode 1 is formed in the silicon semiconductor layer 4 as a photodiode of a lateral PN junction type. The photodiode 1 includes an embedded oxide layer 3 as an insulation layer formed of silicon oxide ($SiO_2$). The embedded oxide layer 3 is formed on a silicon substrate (not shown) formed of silicon. The silicon semiconductor layer 4 is formed of a thin single crystal silicon, and is formed on the silicon substrate with the embedded oxide layer 3 in between, thereby constituting a semiconductor wafer having an SOI (Silicon on Insulator) structure.

In the embodiment, a diode forming area 6 is defined on the silicon semiconductor layer 4 for forming the photodiode 1. Further, an element separation area 10 (refer to FIGS. 5(A) to 5(D)) with a rectangular shape surrounds the diode forming area 6 for forming an element separation layer 9.

In the embodiment, the element separation layer 9 is formed in the silicon semiconductor layer 4 in the element separation area 10, and reaches the embedded oxide layer 3. The element separation layer 9 is formed of an insulation material such as silicon oxide, and has a function of electrically separating in the diode forming area 6. As shown in FIGS. 1 and 2, the element separation layer 9 is represented as a hatched area. The photodiode 1 is formed in the silicon semiconductor layer 4 in the diode forming area 6 defined thereon.

In the embodiment, the photodiode 1 includes a P+ diffusion layer 12 as a P-type high concentration diffusion layer. A P-type impurity such as boron (B) and the likes is diffused in the silicon semiconductor layer 4 in the diode forming area 6 at a high concentration to form the P+ diffusion layer 12. The P+ diffusion layer 12 has a comb shape formed of a base portion 12a contacting with an inner side of the element separation layer 9 and a plurality of teeth portions 12b extending from the base portion 12a toward an opposite inner side of the element separation layer 9. More specifically, the P+ diffusion layer 12 is formed in a n character shape, in which two teeth portions 12b extend from the base portion 12a.

In the embodiment, the photodiode 1 further includes an N+ diffusion layer 14 as an N-type high concentration diffusion layer. An N-type impurity such as phosphorous (P) and arsenic (As), i.e., an opposite type to that of the P-type high concentration diffusion layer 12, is diffused in the silicon semiconductor layer 4 in the diode forming area 6 at a relatively high concentration to form the N+ diffusion layer 14. The N+ diffusion layer 14 has a comb shape formed of a base portion 14a contacting with the opposite inner side of the element separation layer 9 and a plurality of teeth portions 14b extending from the base portion 14a toward the inner side of the element separation layer 9. More specifically, the N+ diffusion layer 14 is formed in an E character shape, in which three teeth portions 14b extend from the base portion 14a at both end portions and a center portion thereof.

In the embodiment, the photodiode 1 further includes a P− diffusion layer 15 as a low concentration diffusion layer. A P-type impurity is diffused at a relatively low concentration in a portion of the silicon semiconductor layer 4 contacting with the P+ diffusion layer 12 and the N+ diffusion layer 14 with the teeth portions 12b and 14b thereof nested with each other to form the P− diffusion layer 15. A depletion layer is formed in the P− diffusion layer 15, so that ultraviolet light absorbed in the depletion layer generates electron-hole pairs in the P− diffusion layer 15.

In the embodiment, the photodiode 1 further includes an interlayer insulation film 17 formed on the silicon semiconductor layer 4. The interlayer insulation film 17 is formed of an insulation material such as silicon oxide and NSG (Non-doped Silica Glass) having transparency relative to the UV-A light, the UV-B light, and visible light, i.e., light in the wavelength region higher than the UV-B light. The interlayer insulation film 17 has a thickness of about 4,000 nm.

In the embodiment, the photodiode 1 further includes contact holes 18 formed in forming areas of contact plugs 19 in the interlayer insulation film 17. The contact holes 18 pass through the interlayer insulation film 17 and reach the P+ diffusion layer 12 and the N+ diffusion layer 14. A conductive material such as aluminum (Al), tungsten (W), titanium (Ti) and the likes is filled in the contact holes 18 to form the contact plugs 19.

As shown in FIG. 1, the photodiode 1 further includes wiring portions 20 formed on the interlayer insulation film 17 through etching a wiring layer formed of a conductive material similar to that of the contact plugs 19. The wiring portions 20 are arranged not to block the P− diffusion layer 15 from sunlight as indicated with a phantom line in FIG. 1. Further, the wiring portions 20 are electrically connected to the P+ diffusion layer 12 and the N+ diffusion layer 14 through the contact plugs 19.

In the embodiment, the photodiode 1 further includes a passivation film 22 as a protective film formed on the interlayer insulation film 17. The passivation film 22 is formed of silicon nitride ($Si_3N_4$), and has a thickness of about 300 nm, so that light in the wavelength region higher than the UV-B light can pass therethrough. The passivation film 22 has a function of protecting the photodiode 1, the wiring portions 20, and the likes from external humidity and the likes.

Figure 4:
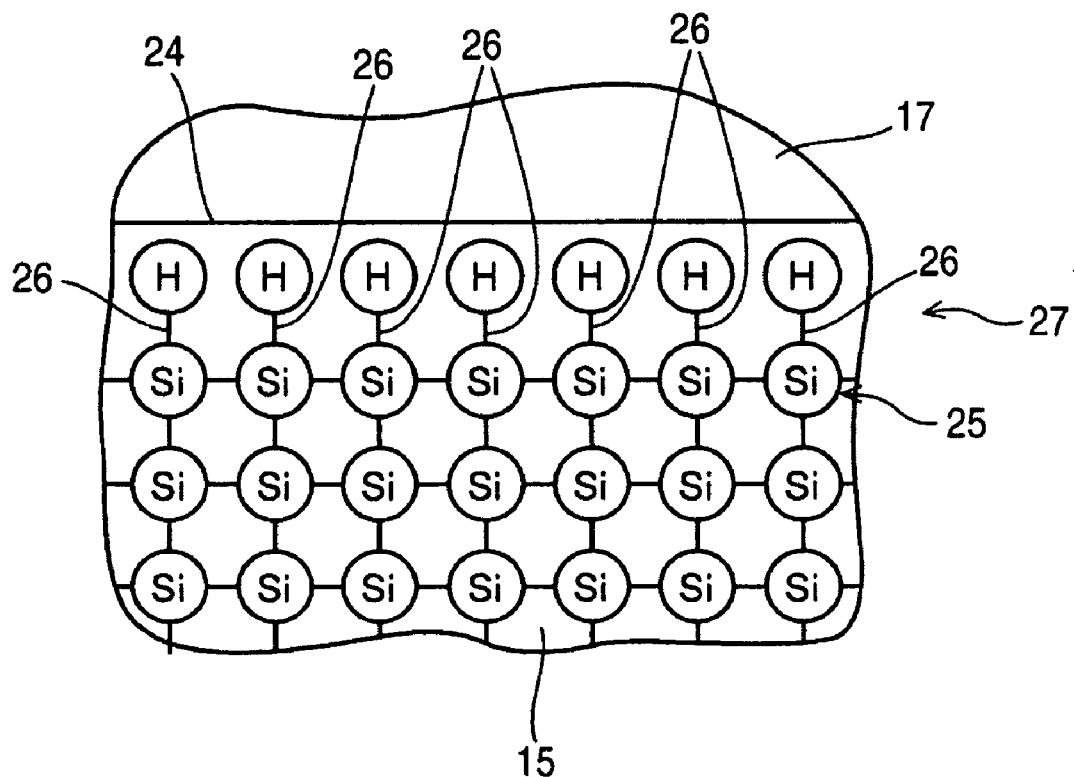
FIG. 4 is a schematic view showing an arrangement of silicon atoms near an interface between a low concentration diffusion layer and an interlayer insulation film of the photodiode according to the first embodiment of the present invention.

FIG. 4 is a schematic view showing an arrangement of silicon atoms near an interface 24 between the P− diffusion layer 15 and the interlayer insulation film 17 of the photodiode 1 according to the first embodiment of the present invention.

As shown in FIG. 4, in the photodiode 1, the interface 24 is formed in the silicon semiconductor layer 4 between the P− diffusion layer 15 and the interlayer insulation film 17. In the silicon semiconductor layer 4 at the interface 24, silicon (Si) atoms 25 with dangling bonds (non-bonded bonds) 26 are arranged in a row. The dangling bonds 26 are terminated with hydrogen (H) to form a covalent bond between silicon and hydrogen, so that the covalent bond blocks ultraviolet light in the wavelength region of the UV-A light. Accordingly, the interface 24 (or an UV-A filter 27) has a filter function of passing visible light and light lower than the UV-B light therethrough.

The covalent bond between silicon and hydrogen has a bond energy of 3.1 to 3.5 eV corresponding to an energy of light with a wavelength between about 350 nm to 400 nm, which is included in the wavelength region of the UV-A light. When the covalent bond between silicon and hydrogen (the Si—H bond) is broken with an energy of the UV-A light, the energy in the wavelength is absorbed, thereby absorbing ultraviolet light in the wavelength region of the UV-A light. Accordingly, only the UV-A light does not pass through the UV-A filter 27 formed of the covalent bond between silicon and hydrogen (refer to FIG. 7).

Figure 3:
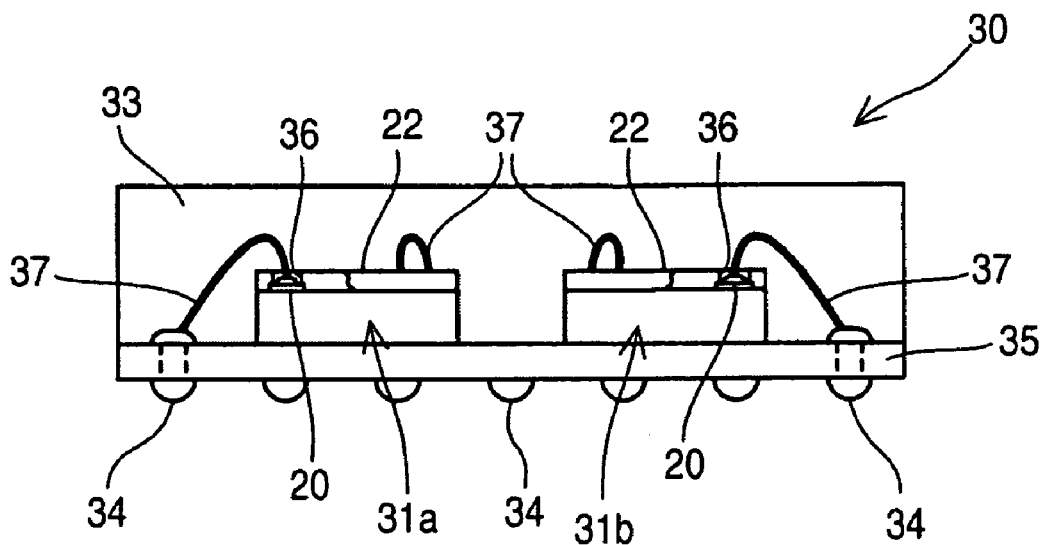
FIG. 3 is a schematic side view showing an ultraviolet sensor according to the first embodiment of the present invention.

FIG. 3 is a schematic side view showing an ultraviolet sensor 30 according to the first embodiment of the present invention. As shown in FIG. 3, the ultraviolet sensor 30 includes a photo chip 31a and a photo chip 31b. The photo chip 31a is formed of the photodiode 1 with the UV-A filter 27 formed through a step of cutting a semiconductor wafer with a plurality of photodiodes in pieces. The photo chip 31b is formed of a photodiode having a configuration the same as that of the photodiode 1 without the UV-A filter 27.

In the embodiment, the ultraviolet sensor 30 further includes s sealing layer 33 as a protective layer. The sealing layer 33 is formed through a step of heating and curing a sealing resin such as a silicone resin, an epoxy resin, and the likes having transparency relative to light in the wavelength region higher than the UV-B light. The sealing layer 33 has a function of protecting the photo chip 31a and the photo chip 31b from external humidity and the likes.

In the embodiment, the sealing resin having transparency relative to ultraviolet light includes a silicone resin with good weather resistance against humidity, ultraviolet light, and the likes. A plurality of external terminal 34 is formed on a ceramic substrate 35, and a plurality of the photo chips 31a and the photo chips 31b is disposed on the ceramic substrate 35. Each of the photo chips 31a and the photo chips 31b is connected with a silver paste and the likes. Then, the wiring portions 20 exposed in terminal holes 36 are electrically connected to the external terminals 30 through wires 37 with a wire bonding method. The photo chips 31a and the photo chips 31b are covered with the sealing layer 33 formed of the silicon resin, thereby obtaining the external terminals 30.

A method of producing the photodiode described above will be explained with reference to FIGS. 5(A)-5(D) to 6(A)-6(B).

Figure 5A:
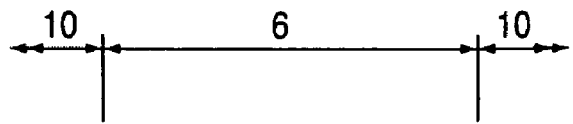
FIGS. 5(A) to 5(D) are schematic sectional views No. 1 showing a method of producing the photodiode according to the e first embodiment of the present invention.
Figure 5B:
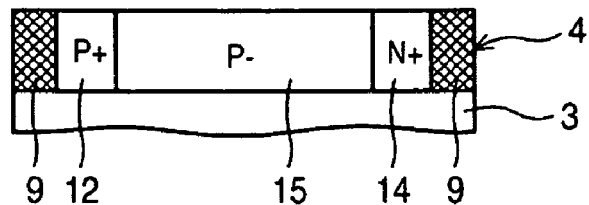
Figure 5C:
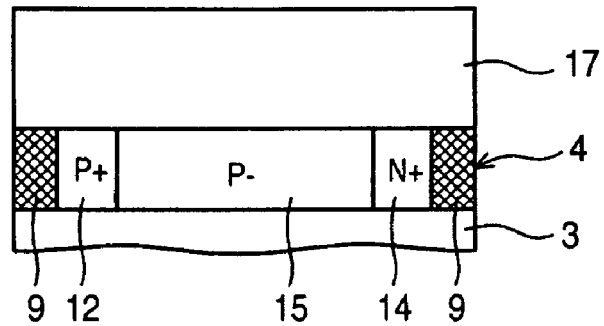
Figure 5D:
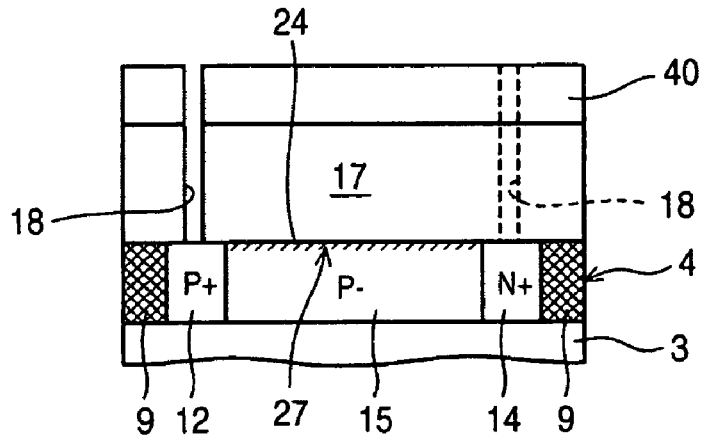

As shown in FIG. 5(D), through lithography, a resist of a positive type or a negative type is coated on the silicon semiconductor layer 4, and the resist is exposed and developed to form a resist mask 40. The resist mask 40 functions as a mask in an etching process and an ion implantation process. In the embodiment, the silicon semiconductor layer 4 has a thickness between 40 nm and 100 nm (such as 50 nm), thereby preventing sheet resistivities of the P+ diffusion layer 12 and the N+ diffusion layer 14 from increasing.

In the embodiment, a thin silicon layer is formed on the embedded oxide layer 3 with an SIMOX (Separation by Implanted Oxygen) method to form the semiconductor wafer having the SOI structure. Alternatively, a thin silicon layer is attached to the embedded oxide layer 3 to form the semiconductor wafer having the SOI structure. Then, a sacrifice oxide layer is formed on the thin silicon layer on the embedded oxide layer 3 with a thermal oxidation method. Afterward, the sacrifice oxide layer is removed through wet etching, thereby obtaining the silicon semiconductor layer 4 having a thickness of 50 nm.

In the next step, a resist mask (not shown) is formed through photolithography for exposing an area for forming the N+ diffusion layer 14 (an area having the E character shape shown in FIG. 1) in the diode forming area 6. Then, the N-type impurity is implanted into the silicon semiconductor layer 4, thereby forming an N-type high concentration implanted layer.

After the resist mask is removed, a resist mask (not shown) is formed through photolithography for exposing an area for forming the P+ diffusion layer 12 (an area having the n character shape shown in FIG. 1) in the diode forming area 6. Then, the P-type impurity is implanted in the silicon semiconductor layer 4 thus exposed at a high concentration, thereby forming a P-type high concentration implanted layer.

In the next step, after the resist mask is removed, the impurities implanted into each of the implanted layers formed in each of the areas for forming each of the diffusion layers are activated, so that the impurities of the specific types are diffused in each of the diffusion layers at specific concentrations. As a result, the P+ diffusion layer 12, the N+ diffusion layer 14, and the P− diffusion layer 15 are formed in the diode forming area 6. Accordingly, there is prepared the semiconductor wafer having the SOI structure, in which the photodiode 1 of the lateral PN junction type is formed in the silicon semiconductor layer 4.

As shown in FIG. 5(B), in the next step, silicon oxide is deposited on the silicon semiconductor layer 4 of the semiconductor wafer. Then, an upper surface of silicon oxide is flattened, thereby forming the interlayer insulation film 17.

As shown in FIG. 5(C), in the next step, after the interlayer insulation film 17 is formed, the semiconductor wafer is placed in a thermal processing device to increase a temperature of the semiconductor wafer through a thermal processing under a hydrogen atmosphere. Accordingly, in the interface 24 formed in the silicon semiconductor layer 4 between the P− diffusion layer 15 and the interlayer insulation film 17, the dangling bonds 26 of the silicon (Si) atoms 25 are terminated with hydrogen (H) to form the covalent bond between silicon and hydrogen (Si—H).

In the thermal processing under the hydrogen atmosphere, for example, a mixture of 90% of Nitrogen ($N_2$) and 10% of hydrogen ($H_2$) is used, and the semiconductor wafer is processed at a temperature within a range between 250° C. and 450° C. for 30 minutes. As a result, the UV-A filter 27 for blocking ultraviolet light in the wavelength region of the UV-A light is formed adjacent to the interface 24 between the P− diffusion layer 15 and the interlayer insulation film 17.

As shown in FIG. 5(D), in the next step, after the UV-A filter 27 is formed, the resist mask 40 is formed on the interlayer insulation film 17 through lithography for exposing the interlayer insulation film 17 in areas for forming the contact holes 18 on the P+ diffusion layer 12 and the N+ diffusion layer 14 of the photodiode 1. Then, the interlayer insulation film 17 is etched through anisotropy etching with the resist mask 40 as a mask for selectively etching silicon. Accordingly, the contact holes 18 are formed to penetrate the interlayer insulation film 17 and reach the P+ diffusion layer 12 and the N+ diffusion layer 14.

Figure 6A:
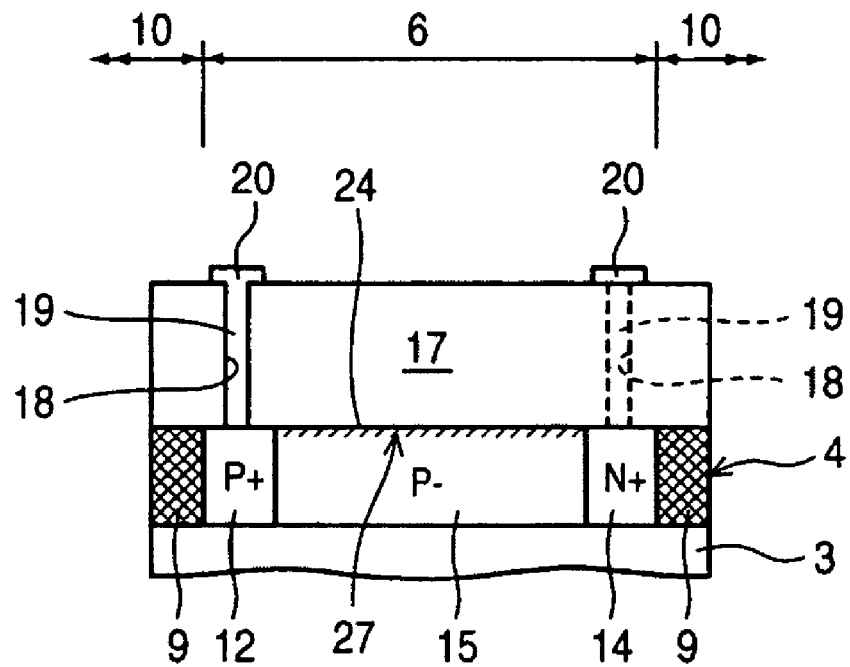
FIGS. 6(A) and 6(B) are schematic sectional views No. 2 showing the method of producing the photodiode according to the first embodiment of the present invention.

As shown in FIG. 6(A), after the resist mask 40 formed in the step shown in FIG. 5(D) is removed, a conductive material fills the contact holes 18 with a sputter method and the likes to form the contact plugs 19. At the same time, a wiring layer for forming the wiring portions 20 is formed on the interlayer insulation film 17 using a conductive material the same as that of the contact plugs 19. Then, a resist mast (not shown) is formed on the wiring later through photolithography for covering areas for forming the wiring portions 20. Then, the wiring layer is etched with the resist mask as a mask for forming the wiring portions 20 electrically connected to the contact plugs 19. Afterward, the resist mask is removed.

Figure 6B:
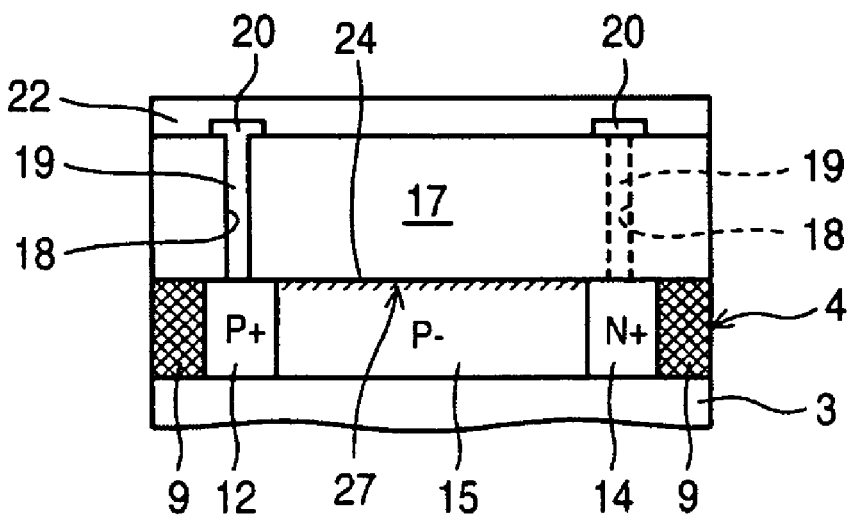

As shown in FIG. 6(B), the passivation film 22 formed of silicon nitride is formed on the interlayer insulation film 17 and the wiring portions 20 of the photodiode 1. Then, a resist mast (not shown) is formed on the passivation film 22 through photolithography for exposing areas for forming terminal holes 36 (refer to FIG. 3) in the wiring portions 20. Then, the passivation film 22 is etched through anisotropy etching to form the terminal holes 36. Lastly, the semiconductor wafer is divided into pieces, thereby forming the photo chip 31a (refer to FIG. 3) having the photodiode 1 with the UV-A filter 27.

Through a process similar to that described above except the step shown in FIG. 5(C), a photodiode without the UV-A filter 27 is formed on the semiconductor wafer having the silicon semiconductor layer 4 with the same thickness. Then, the semiconductor wafer is divided into pieces, thereby forming the photo chip 31b (refer to FIG. 3) without the UV-A filter 27.

As shown in FIG. 3, the photo chip 31a and the photo chip 31b are arranged on the ceramic substrate 35 side by side, and are connected with each other with a silver paste and the likes. The wiring portions 20 exposed from the terminal holes 35 are electrically connected to the outer terminals 34 through wires 37 with a wire bonding method. Then, the photo chip 31a and the photo chip 31b are disposed in a frame member. A silicone resin is poured through potting, and then is heated and cured to form the sealing layer 33 covering the photo chip 31a and the photo chip 31b.

Figure 7:
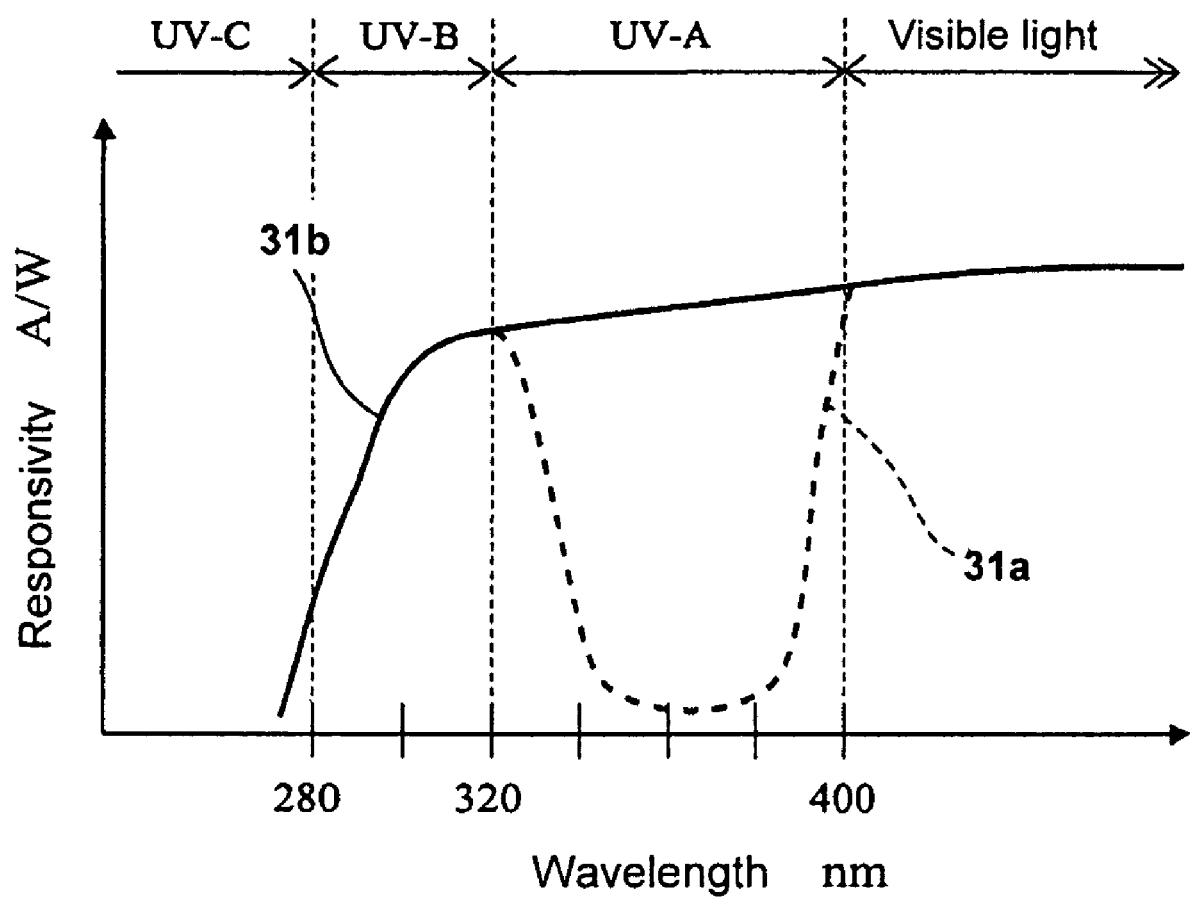
FIG. 7 is a graph showing a spectral responsivity of a photo chip according to the first embodiment of the present invention.

FIG. 7 is a graph showing a spectral responsivity of the photo chip 31a and the photo chip 31b according to the first embodiment of the present invention. As described above, the photo chip 31b includes the photodiode 1 without the UV-A filter 27. Further, ultraviolet light in the wavelength regions of the UV-A light and the UV-B light, and visible light pass through the interlayer insulation film 17, the passivation film 22, and the sealing layer 33. Accordingly, when light irradiates on the photo chip 31b, since silicon has a band gap of about 1.1 eV, the photo chip 31b exhibits a property showing the spectral responsivity over a whole range of wavelength region less than about 1,100 nm as indicated with a solid line in FIG. 7.

As described above, the photo chip 31a includes the photodiode 1 having the UV-A filter 27 formed of the Si—H bond at the interface 24 between the P– diffusion layer 15 and the interlayer insulation film 17. Accordingly, when light passes from the interlayer insulation film 17 through the UV-A filter 27 formed at the interface 24 between the P– diffusion layer 15 and the interlayer insulation film 17, the Si—H bond of the UV-A filter 27 absorbs ultraviolet light in the wavelength region of the UV-A light with the bond energy thereof. Accordingly, it is possible to block only the UV-A light regardless of the thickness of the silicon semiconductor layer 4. When light irradiates through the interlayer insulation film 17 and the likes, the photo chip 31a exhibits a property showing the spectral responsivity blocking only the UV-A light as indicated with a broken line in FIG. 7.

In the embodiment, even when the Si—H bond is formed in an interface between the P– diffusion layer 15 and the embedded oxide layer 3 in the step shown in FIG. 5(C), light passes through the P– diffusion layer 15 from the interlayer insulation film 17, and reacts with the Si—H bond formed in the interface between the P– diffusion layer 15 and the embedded oxide layer 3, thereby causing no influence on an output of the photodiode 1.

As described above, the photo chip 31b including the photodiode 1 without the UV-A filter 27 detects visible light and ultraviolet light in the wavelength regions of the UV-A light and the UV-B light. The photo chip 31a including the photodiode 1 with the UV-A filter 27 blocks ultraviolet light in the wavelength region of the UV-A light. Accordingly, it is possible to determine an amount of ultraviolet light in the wavelength region of the UV-A light through calculating a difference between outputs of the photo chip 31a and the photo chip 31b. Accordingly, it is possible to stably detect the amount of ultraviolet light only in the wavelength region of the UV-A light, which is a major component of ultraviolet light reaching the ground level.

In the embodiment, when the photodiode 1 of the lateral PN junction type disposed in each of the photo chip 31a and the photo chip 31b absorbs light, the spectral responsivity varies depending on the thickness of the silicon semiconductor layer 4. Accordingly, when the thickness of the silicon semiconductor layer 4 varies in each of different semiconductor wafers, the spectral responsivity varies in regions other than the wavelength region of the UV-A light. In this case, the output of the photo chip 31b is multiplied by a number for cancelling out an output of the visible light region. Then, the difference between the outputs of the photo chip 31a and the photo chip 31b is calculated. In this way, it is possible to accurately detect an amount of ultraviolet light.

As described above, in the embodiment, the photodiode 1 with the UV-A filter 27 is formed in the silicon semiconductor layer 4 of the semiconductor wafer having the SOI structure. When light passes through the Si—H bond formed in the interface 24 between the P– diffusion layer 15 and the interlayer insulation film 17, the Si—H bond of the UV-A filter 27 absorbs ultraviolet light in the wavelength region of the UV-A light with the bond energy thereof. Accordingly, it is possible to provide the silicon semiconductor layer 4 with a various thickness.

For example, the silicon semiconductor layer 4 may be formed of a bulk substrate formed of silicon. In this case, it is possible to increase the thickness of the silicon semiconductor layer 4, thereby reducing the variance in the spectral responsivity due to the thickness of the silicon semiconductor layer 4. Further, the photodiode 1 may be combined with a photodiode without the UV-A filter 27 formed on the bulk substrate, thereby obtaining an ultraviolet sensor similar to that described above.

Second Embodiment

Figure 8:
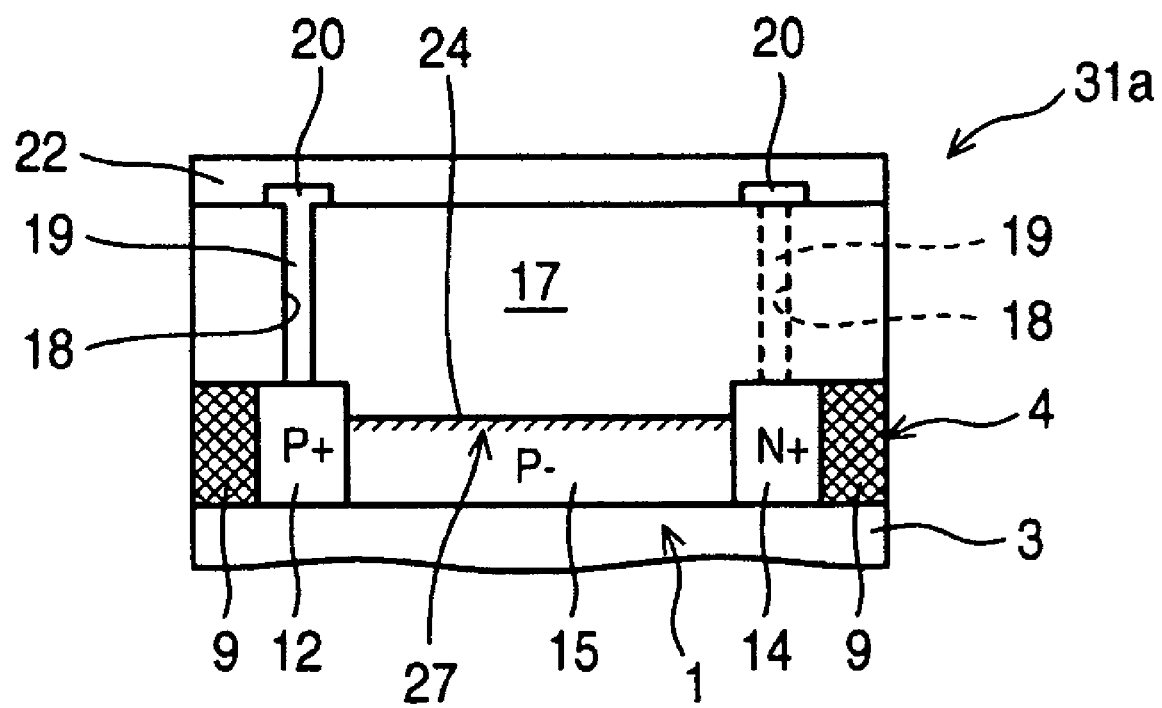
FIG. 8 is a schematic sectional view showing a photodiode according to a second embodiment of the present invention.

A second embodiment of the present invention will be explained next. FIG. 8 is a schematic sectional view showing the photodiode 1 according to the second embodiment of the present invention.

In the first embodiment, the P– diffusion layer 15 is formed in the silicon semiconductor layer 4 having the thickness the same as that of the P+ diffusion layer 12 and the N+ diffusion layer 14. Alternatively, the P– diffusion layer 15 may be formed in the silicon semiconductor layer 4 having a thickness between 3 nm and 36 nm (for example, 35 nm) As shown in FIG. 8, the P– diffusion layer 15 is formed in the silicon semiconductor layer 4 having a thickness smaller than that of the P+ diffusion layer 12 and the N+ diffusion layer 14. In this case, the P– diffusion layer 15 does not react with light in a wavelength region higher than visible light (wavelength of 400 nm or higher). When light passes from the interlayer insulation film 17 through the UV-A filter 27 formed in the interface 24 between the P– diffusion layer 15 and the interlayer insulation film 17, ultraviolet light in the wavelength region of the UV-A light is blocked with the bond energy of the Si—H bond. Further, the silicon semiconductor layer 4 with the small thickness blocks visible light.

Figure 9:
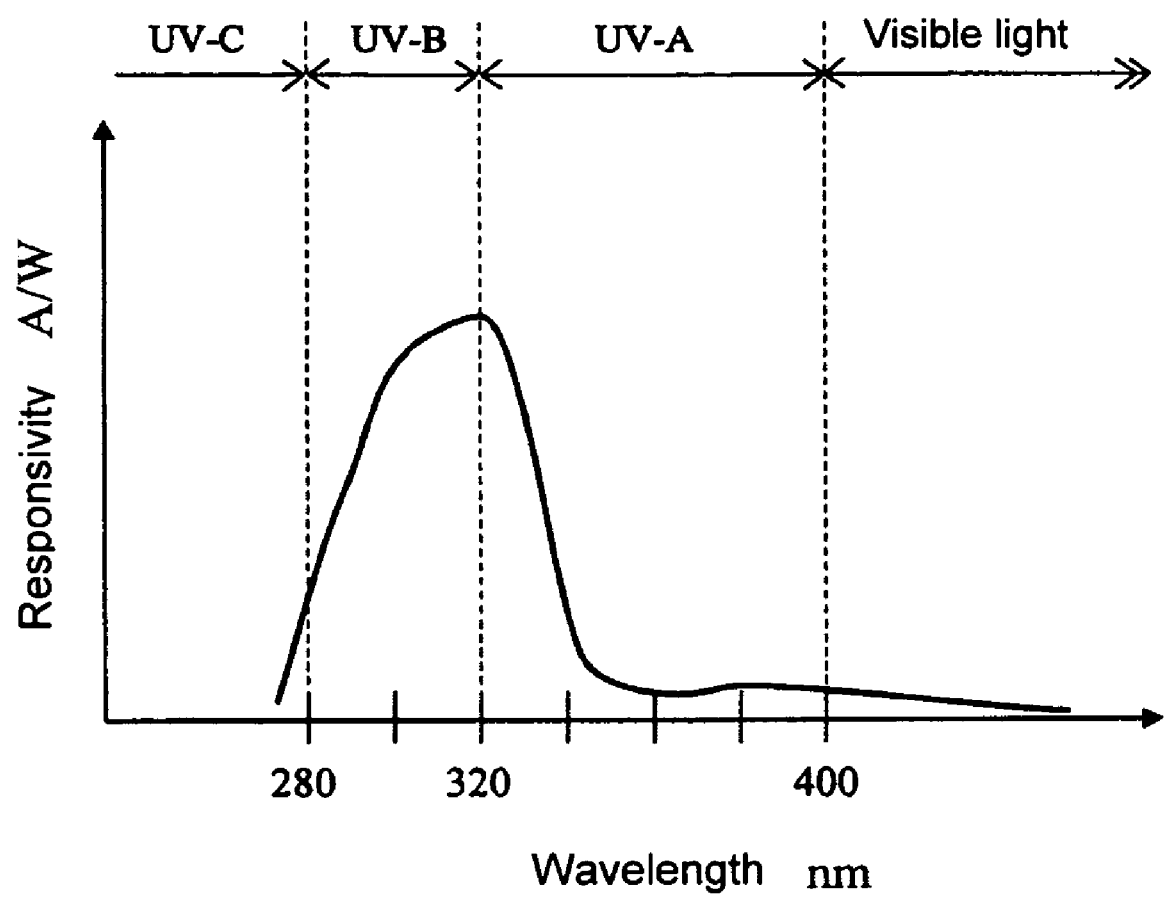
FIG. 9 is a graph showing a spectral responsivity of the photodiode according to the second embodiment of the present invention.

FIG. 9 is a graph showing a spectral responsivity of the photodiode 1 according to the second embodiment of the present invention. As shown in FIG. 9, the photodiode 1 exhibits a property showing the spectral responsivity for detecting only ultraviolet light in the wavelength region of the UV-B light as indicated with a solid line in FIG. 9.

In the embodiment, when the P– diffusion layer 15 is formed in the silicon semiconductor layer 4 of the photodiode 1, a thin layer forming area for forming the P– diffusion layer 15 is defined in the diode forming area 6 between the P+ diffusion layer 12 with the n character shape and the N+ diffusion layer 14 with the E character shape (refer to FIG. 1). After the step shown in FIG. 5(A) is completed, a resist mask is formed on the silicon semiconductor layer 4 through photolithography for exposing the silicon semiconductor layer 4 in the thin layer forming area. Then, the silicon semiconductor layer 4 thus exposed is etched through anisotropy etching with the resist mask as a mask, thereby reducing the thickness of the silicon semiconductor layer 4 to 35 nm in the thin layer forming area.

After the P– diffusion layer 15 is formed in the step described above, the subsequent steps shown in FIG. 5(B) to 6(B) are performed, thereby obtaining the photodiode 1 shown in FIG. 8.

As described above, in the embodiments, the P+ diffusion layer 12 and the N+ diffusion layer 14 are formed in the silicon semiconductor layer 4, and are arranged to face with each other with the P– diffusion layer 15 in between. Further, the UV-A filter 27 having the Si—H bond is formed in the interface 24 between the P– diffusion layer 15 and the interlayer insulation film 17. Accordingly, when light passes from the interlayer insulation film 17 through the UV-A filter 27 formed in the interface 24 between the P– diffusion layer 15 and the interlayer insulation film 17, ultraviolet light in the wavelength region of the UV-A light is blocked with the bond energy of the Si—H bond regardless of the thickness of the silicon semiconductor layer 4.

When the photodiode 1 is combined with another photodiode without the UV-A filter 27, it is possible to determine an amount of ultraviolet light only in the wavelength region of the UV-A light through the calculation. Accordingly, it is possible to obtain the ultraviolet sensor capable of stably detecting the amount of ultraviolet light only in the wavelength region of the UV-A light, which is a major component of ultraviolet light reaching the ground level.

Further, when the silicon semiconductor layer 4 where the P– diffusion layer 15 is formed has the thickness between 3 nm and 36 nm, ultraviolet light in the wavelength region of the UV-A light is blocked with the covalent energy of the Si—H bond between silicon and hydrogen. At the same time, visible light is blocked with the silicon semiconductor layer 4. Accordingly, it is possible to obtain the ultraviolet sensor capable of selectively detecting an amount of ultraviolet light only in the wavelength region of the UV-B light.

In the embodiments, in the ultraviolet sensor, the photo diodes are arranged in parallel on the ceramic substrate, and not necessarily in parallel as far as arrange on the ceramic substrate. Further, the P-type impurity is diffused to form the P– diffusion layer 15, and the N-type impurity may be diffused to form the low concentration implanted layer.

In the embodiments, the P+ diffusion layer is formed in the n character shape, and the N+ diffusion layer is formed in the E character shape. Alternatively, the P+ diffusion layer and the N+ diffusion layer may be formed in other shape and have a larger number of teeth portions.

In the embodiment, the P+ diffusion layer and the N+ diffusion layer have the teeth portions, and the teeth portions are nested with each other. Alternatively, the P+ diffusion layer and the N+ diffusion layer may have only the base portions arranged to face each other with the low concentration diffusion layer in between.

In the embodiment, the silicon semiconductor layer is formed on the embedded oxide film, i.e., the insulation layer of the semiconductor wafer having the SOI structure, or is formed on the bulk substrate. Alternatively, the silicon semiconductor layer may be formed on a sapphire substrate as an insulation layer, i.e., a silicon semiconductor layer of an SOS (Silicon on Sapphire) substrate, or may be formed on a quartz substrate as an insulation layer, i.e., a silicon semiconductor layer of an SOQ (Silicon on Quartz) substrate.

The disclosure of Japanese Patent Application No. 2008-011906, filed on Jan. 22, 2008, is incorporated in the application by reference.

While the invention has been explained with reference to the specific embodiments of the invention, the explanation is illustrative and the invention is limited only by the appended claims.

What is claimed is:

1. A photodiode comprising:
   a silicon semiconductor layer;
   a P-type high concentration diffusion layer formed in the silicon semiconductor layer, said P-type high concentration diffusion layer including a P-type impurity diffused therein at a high concentration;
   an N-type high concentration diffusion layer formed in the silicon semiconductor layer, said N-type high concentration diffusion layer including an N-type impurity diffused therein at a high concentration;
   a low concentration diffusion layer with one of the P-type impurity and the N-type impurity diffused therein at a low concentration, said low concentration diffusion layer being formed in the silicon semiconductor layer, so that the P-type high concentration diffusion layer and the N-type high concentration diffusion layer are arranged to face each other with the low concentration diffusion layer in between;
   an interlayer insulation film formed on the silicon semiconductor layer;
   an UV-A filter disposed between the low concentration diffusion layer and the interlayer insulation film for blocking ultraviolet light, said UV-A filter including a covalent bond between silicon and hydrogen adjacent to the interlayer insulation film;
   a first contact plug formed in the interlayer insulation film and contacting with the N-type high concentration diffusion layer; and
   a first wiring portion formed on the interlayer insulation film and contacting with the first contact plug, said first wiring portion being arranged in a first area where the low concentration diffusion layer does not exist on an opposite side of the interlayer insulation film.

2. The photodiode according to claim 1, wherein said silicon semiconductor layer where the low concentration layer is formed has a thickness between 3 nm and 36 nm.

3. An ultraviolet sensor comprising a first photodiode and a second photodiode, said first photodiode being formed of the photodiode according to claim 1.

4. The photodiode according to claim 1, further comprising a silicon substrate so that the silicon semiconductor layer is formed on the silicon substrate.

5. The photodiode according to claim 1, further comprising an embedded oxide layer so that the silicon semiconductor layer is formed on the embedded oxide layer.

6. The photodiode according to claim 1, further comprising an passivation film formed on the interlayer insulation film.

7. The photodiode according to claim 1, further comprising a second contact plug formed in the interlayer insulation film and contacting with the P-type high concentration diffusion layer; and
   a second wiring portion formed on the interlayer insulation film and contacting with the second contact plug, said second wiring portion being arranged in a second area where the low concentration diffusion layer does not exist on the opposite side of the interlayer insulation film, said second area being arranged away from the first area.

8. A method of producing a photodiode, comprising the steps of:
   preparing a semiconductor wafer including a silicon semiconductor layer, a low concentration diffusion layer with one of a P-type impurity and an N-type impurity diffused therein at a low concentration, a P-type high concentration diffusion layer with the P-type impurity diffused therein at a first high concentration, and an N-type high concentration diffusion layer with the N-type impurity diffused therein at a second high concentration, said low concentration diffusion layer being formed in the silicon semiconductor layer so that the P-type high concentration diffusion layer and the N-type high concentration diffusion layer are arranged to face each other with the low concentration diffusion layer in between;
   forming an insulation material layer on the silicon semiconductor layer;
   performing a thermal process on the semiconductor wafer under hydrogen atmosphere to form an UV-A filter between the low concentration diffusion layer and the interlayer insulation film for blocking ultraviolet light, said UV-A filter including a covalent bond between silicon and hydrogen adjacent to the interlayer insulation film
   forming a first contact plug in the interlayer insulation film so that the first contact plug contacts with the N-type high concentration diffusion layer; and
   forming a first wiring portion on the interlayer insulation film so that the first wiring portion contacts with the first contact plug, said first wiring portion being arranged in a first area where the low concentration diffusion layer does not exist on an opposite side of the interlayer insulation film.

9. The method of producing the photodiode according to claim 8, wherein, in the step of preparing the semiconductor wafer, said silicon semiconductor layer where the low concentration layer is formed has a thickness between 3 nm and 36 nm.

10. The method of producing the photodiode according to claim 8, further comprising the steps of,
   forming a second contact plug in the interlayer insulation film so that the second contact plug contacts with the P-type high concentration diffusion layer; and
   forming a second wiring portion on the interlayer insulation film so that the second wiring portion contacts with the second contact plug, said second wiring portion being arranged in a second area where the low concentration diffusion layer does not exist on the opposite side of the interlayer insulation film, said second area being arranged away from the first area.

* * * * *